United States Patent [19]
Petrosino

[11] Patent Number: 5,689,635
[45] Date of Patent: Nov. 18, 1997

[54] MICROPROCESSOR MEMORY TEST CIRCUIT AND METHOD

[75] Inventor: Gianluca Petrosino, Phoenix, Ariz.

[73] Assignee: SGS-Thomson Microelectronics, Inc., Carrollton, Tex.

[21] Appl. No.: 579,564

[22] Filed: Dec. 27, 1995

[51] Int. Cl.⁶ ........................................... G06F 11/00
[52] U.S. Cl. ..................... 395/183.18; 395/183.06; 395/182.06
[58] Field of Search ............. 395/183.18, 183.19, 395/183.06, 183.03; 365/201; 371/21.1, 21.2, 22.3, 22.6, 71

[56] References Cited

U.S. PATENT DOCUMENTS

| | | | |
|---|---|---|---|
| 4,525,839 | 7/1985 | Nozawa et al. | 371/38.1 |
| 4,757,474 | 7/1988 | Fukushi et al. | 365/189 |
| 5,060,230 | 10/1991 | Arimoto et al. | 371/21.2 |
| 5,115,191 | 5/1992 | Yoshimori | 371/22.1 X |
| 5,388,104 | 2/1995 | Shirotori et al. | 371/21.1 |

*Primary Examiner*—Robert W. Beausoliel, Jr.
*Assistant Examiner*—Ly V. Hua
*Attorney, Agent, or Firm*—George E. Clark; Theodore E. Galanthay; Lisa K. Jorgenson

[57] ABSTRACT

A circuit and method for testing on-chip memory for a microprocessor or a microcomputer is disclosed. The memory test circuit includes an input register, an output register, an adder, and a sequencer to control the test process. The process includes receiving a simple communication protocol from the control unit to start the test, running a common memory test such as a checker board, AAAAh, 5555h and the like, and then storing the test results in an output register. The test circuit can include a bi-directional RESET signal means for disabling the system while the microprocessor or microcomputer runs its memory test.

20 Claims, 3 Drawing Sheets

MICROPROCESSOR MEMORY TEST CIRCUIT AND METHOD

BACKGROUND OF THE INVENTION

1. Field of the Invention

This invention relates to electronic circuits used in microprocessors and microcontrollers and more specifically to circuits used to test on the on-chip memory in microprocessors and microcontrollers.

2. Description of the Relevant Art

The problem addressed by this invention is encountered in circuits and methods used to test on-chip memory in microprocessors and microcontrollers. Currently, all on-chip memory must be tested in the production factory to assure their functionality and reliability. The testing of memory is necessarily long since each memory cell must be written to, read, compared, and erased many times to check their functionality. As the on-chip memory is increased, the time necessary to test the memory is also increased.

A trend in the development of microprocessors has been to increase the size of on-chip memory. For example, the on-chip cache memory has increased from 8 KByte on the first implementation of the 486 class of microprocessor to 256 Kbytes for the 686 class of microprocessor. The use of on-chip non-volatile memory is also increasing, albeit, not as quickly.

As the size of on-chip memory increases, the chance of rejecting the microprocessor increases since the chances of having a bad memory cell increases. Unfortunately, the processes used to implement microprocessors can not provide non-volatile memory cells for storing the addresses of failed memory cells. Therefore, if just one cell does not work, the chip must be discarded. Furthermore, the cost of micros has also increased and therefore the cost of a memory failure which requires that the micro be discarded has also increased.

Referring to FIG. 1, the functional signal groupings of a 486 generation microprocessor 10 is shown as is known in the prior art. This FIG. 1 shows the input and output signals including the address bus, data bus, bus cycle control signals, and the RESET input signal and the WM_RST signal.

In the prior art, the RESET signal is an active high input signal that, when asserted, suspends all operations in progress and places the 486 into a reset state. RESET is an asynchronous signal but must meet specified setup and hold times to guarantee recognition at a particular clock edge. While RESET is active, only the hold input signal is recognized. The 486 output signals are initialized to their reset state during the internal processor reset sequence. FIG. 4 shows the typical interface for the reset signal as an inverter. It is worth noting that the reset pin only receives the reset signal in the prior art.

The WM_RST (warm reset) signal is an active high input signal that, when asserted, suspends all operations in progress and places the 486 in a known state. WM_RST is an asynchronous signal but must also meet specified setup and hold times to guarantee recognition at a particular clock edge. Configuration Registers remain unchanged. If RESET and WM_RST are asserted simultaneously, WM_RST is ignored and RESET takes priority.

FIG. 2 illustrates the block diagram of a 486 class microprocessor as is known in the prior art. With this type of architecture, on-chip memory is tested by the CPU accessing a test program from external source and then executing the test program. This requires the CPU to be dedicated to the task of testing the on-chip memory. For the newest generations of micros, this test time is extending into a minute or more of test time dedicated to testing the on-chip memory.

Therefore, it is an object of the invention to decrease the test time of on-chip memory.

It is another object of the invention to provide on-chip memory test capability.

It is yet another object of the invention to provide microprocessors with bi-direction reset capability.

These and other objects, features, and advantages of the invention will be apparent to those skilled in the art from the following detailed description of the invention, when read with the drawings and appended claims.

SUMMARY OF THE INVENTION

The disclosed invention can be summarized as a circuit and method for testing on-chip memory for a microprocessor or a microcomputer. The memory test circuit includes an input register, an output register, an adder, and a sequencer to control the test process. The process includes receiving a simple communication protocol from the control unit to start the test, running a common memory test such as a checker board, AAAAh, 5555h and the like, and then storing the test results in an output register. The test circuit can include a bi-directional RESET signal means for disabling the system while the microprocessor or microcomputer runs its memory test.

DETAILED DESCRIPTION OF THE PREFERRED EMBODIMENT

Figure 3:
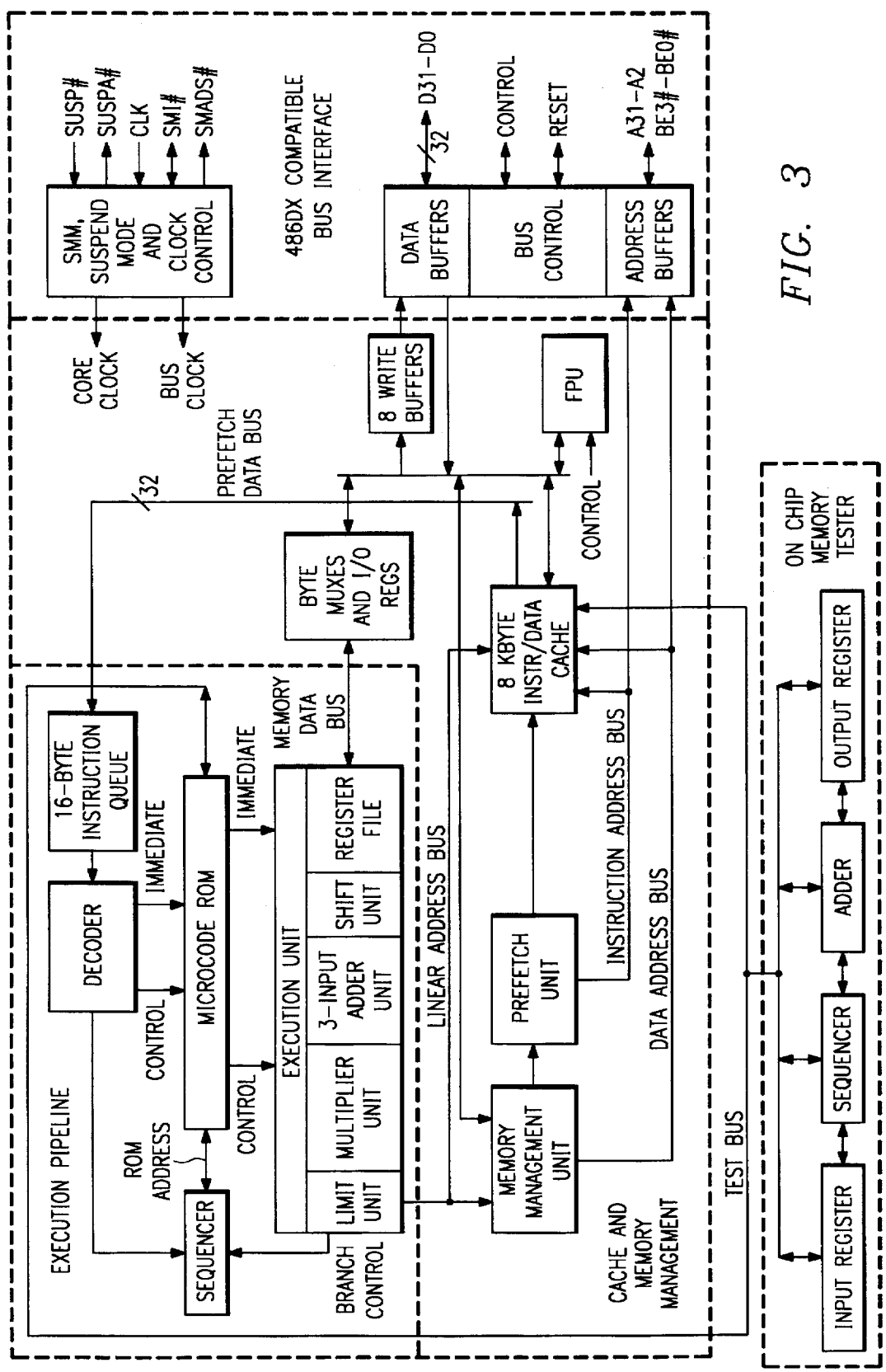
FIG. 3 is a block diagram of a CPU with an on-chip memory tester as is disclosed in an embodiment of the invention.

A microprocessor with an on-chip memory tester constructed according to an embodiment of the invention will now be described. Referring now to FIG. 3, the block diagram of an ST486 plus a on-chip memory tester is disclosed. The ST486 shows the 486 bus interface which includes the data buffers, bus control, and address buffers. The data buffers provide data to (and from) I/O registers, instr/data cache, and the FPU, as is known in the prior art. Similarly, the address buffers provide the address to (and from) the memory management unit and the instr/data cache. The instr/data cache provides instructions to the 16 byte instruction queue which are decoded by the decoder and fed to the sequencer and to the microcode ROM. The instructions are then executed in the execution pipeline as is known in the prior art.

In this embodiment of the invention, an on-chip memory tester is added to the prior art CPU. The on-chip memory tester includes an input register, a sequencer, an adder, and an output register, all coupled together on a test bus. The test bus is also coupled directly to the on-chip memory which, in this case, is the 8 KBytes of cache and the microcode ROM. A very simple communication protocol from the micro can be defined to start the operation of the memory test. Then, the sequencer can control the adder, input register, and output register to implement the basic kinds of tests for memories such as diagonal reading/writing, checkerboards, AAAAh or 5555h writings along with their associated verifies as is known in the prior art. The results of the test can be stored on the output register so that the CPU and then an automated test equipment (ATE) can read the test results.

By having the dedicated hardware to perform the on-chip memory test, the micro is available to start itself. Therefore, the production test time can be dramatically decreased.

As the size of on-chip cache memory increases, the yield of micros has decreased due to memory failures. This is because cache memory is now occupying a higher percentage of area on a chip and thus the odds of at least one of the cache memory cells not working has increased. The micro is discarded if even just one cell fails.

Using the on-chip memory tester disclosed above, it is possible to test the on-chip volatile memory and store the failed cell locations in volatile memory. By designing in additional memory cells, the failed cell can be replaced with the additional volatile memory. The method would require the steps of:
1. testing the non-volatile memory at power-up;
2. storing the location of failed memory cells in extra memory;
3. using redundant volatile memory to replace the failed cells;
4. repeating the process on every power-up.

By using this method, the production yield of high performance micros can be improved by allowing micros which have a few failed memory cells to be mapped and replaced by redundant memory cells at every power-up.

Figure 1:
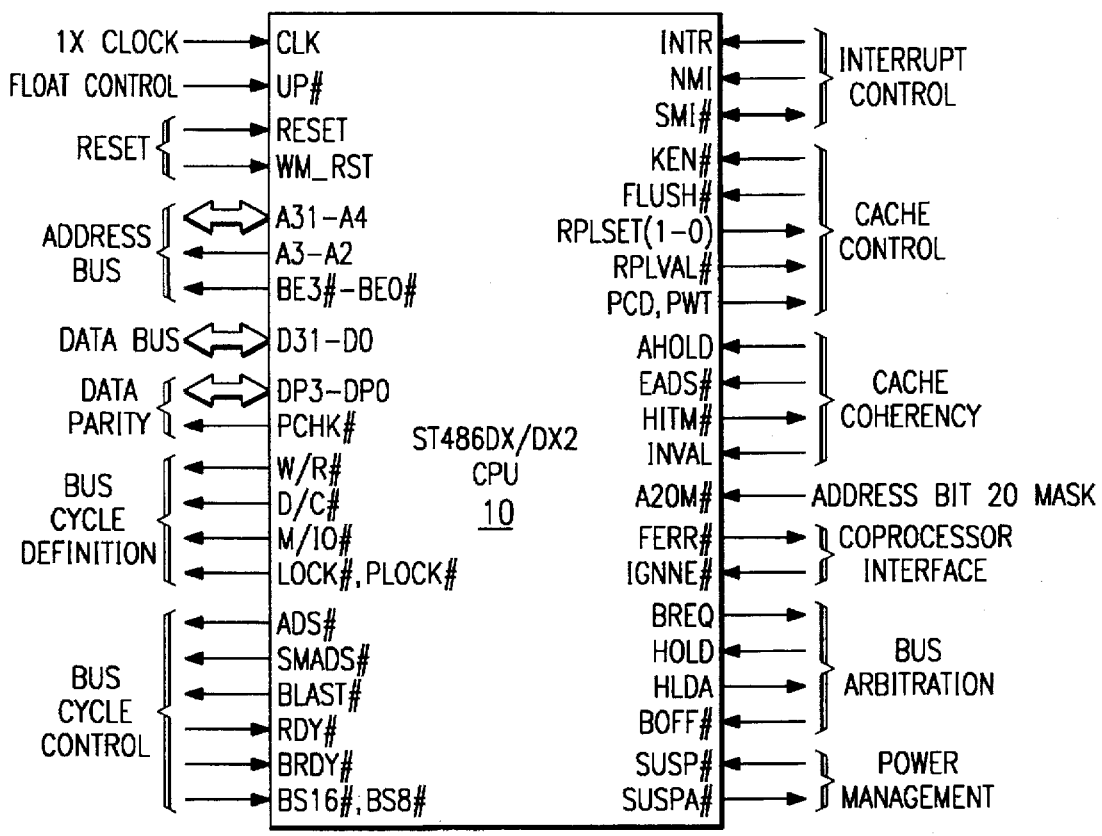
FIG. 1 is a drawing showing the input and output signals of a ST486 CPU as is known in the prior art.
Figure 4:
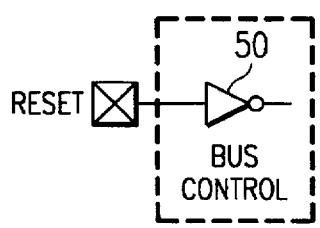
FIG. 4 is a schematic drawing of a reset signal receiver, as is known in the prior art.
Figure 5:
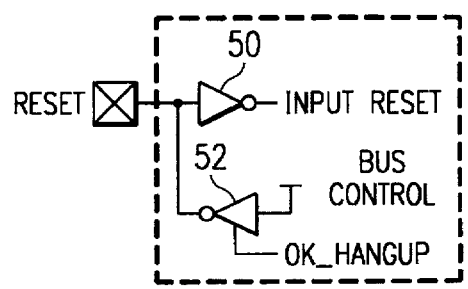
FIG. 5 is a schematic drawing of a reset signal transceiver as is disclosed in an embodiment of the invention.
Figure 2:
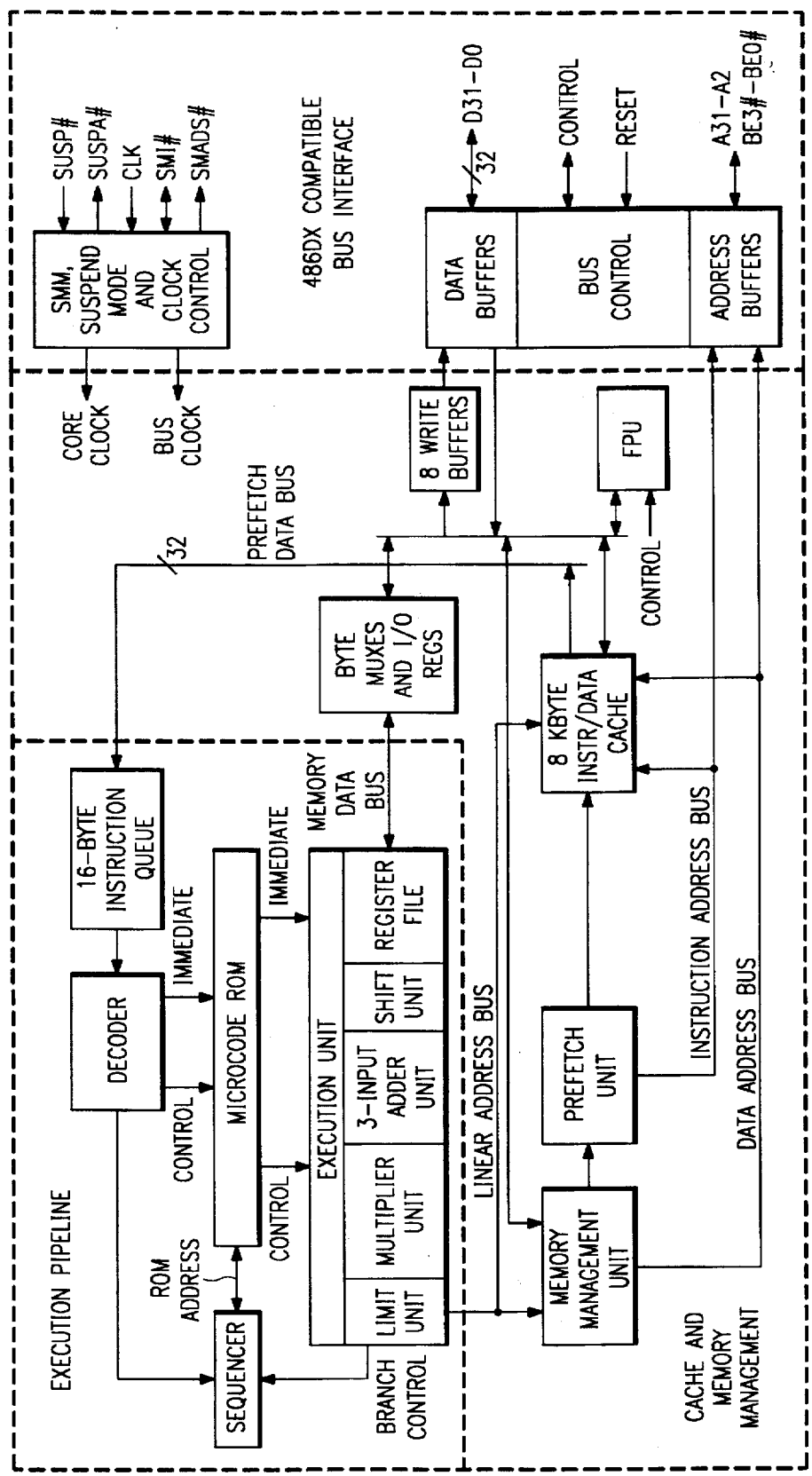
FIG. 2 is a block diagram of an ST486 CPU as is known in the prior art.

To perform the memory test at every power-up, the micro must be able to disable the system until the micro has completed its internal memory testing. It known in the art that all micros are initialized by an external RESET signal controlled by discrete logic on the system board. FIG. 4 illustrates the prior art RESET signal as being limited to an input only signal. For purposes of performing the aforementioned on-chip memory tests, it is desirable for the micro to be able to hold the RESET signal low until the on-chip memory test is complete. Therefore, FIG. 5 shows a bi-directional RESET signal which has an inverter 50 for receiving a RESET signal and an tri-state buffer 52 for sending the RESET signal to the rest of the system. Though not shown, the input to tri-state buffer 52 would be connected to bus control logic of the micro. Tri-state buffer 52 must be robust enough to hold the RESET line against the system source of the RESET signal. Thus, the micro can disable the system until it has completed the on-board memory test.

By having this bi-directional RESET circuit, it is possible for the micro to disable the system until it has completed its internal diagnostics.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A method for testing a plurality of volatile memory cells on a microprocessor for use in an electronic system comprising the steps of:

holding a reset line down after a power-up of said microprocessor to disable the electronic system other than the microprocessor until said plurality of volatile memory cells have been tested;

testing said plurality of volatile memory cells;

replacing a failed memory cell with a redundant memory cell, and, releasing the reset line after said plurality of volatile memory cells have been tested.

2. The method of claim 1 wherein said step of holding a reset line low is performed using a bi-directional reset line.

3. The method of claim 1 wherein the step of testing a plurality of volatile memory cells is performed using an on-chip memory circuit.

4. The method of claim 1 wherein said plurality of volatile memory cells is a plurality of cache memory.

5. The method of claim 1 wherein said plurality of volatile memory cells comprises a RAM memory.

6. The method of claim 1 wherein said plurality of volatile memory cells comprises a static RAM memory.

7. A microprocessor for use in an electronic system comprising:

volatile memory having an address bus and a data bus;

a test bus in addition to the address bus and data bus of said volatile memory;

an on-chip memory test circuit coupled to said test bus; and means for disabling the electronic system other than the microprocessor until said volatile memory had been tested.

8. The microprocessor of claim 7 wherein the on-chip memory test circuit further comprises an input register, a sequencer, an adder, and an output register.

9. The microprocessor of claim 7 wherein said volatile memory comprises a RAM memory.

10. The microprocessor of claim 7 wherein said volatile memory comprises a static RAM memory.

11. The microprocessor of claim 7 wherein said volatile memory comprises a cache memory.

12. The microprocessor of claim 5 wherein said means for disabling the electronic system other than the microprocessor further comprises:

means for holding a reset line down after a power-up of said microprocessor; and means for releasing the reset line after said volatile memory has been tested.

13. The microprocessor of claim 7 further comprising:

means for replacing a failed memory cell with a redundant memory cell.

14. A microcontroller for use in an electronic system comprising:

volatile memory having an address bus and a data bus;

a test bus in addition to the address bus and data bus of said volatile memory;

an on-chip memory test circuit coupled to said test bus; and means for disabling the electronic system other then microcontroller until said volatile memory has been tested.

15. The microcontroller of claim 14 wherein the on-chip memory test circuit further comprises an input register, a sequencer, an adder, and an output register.

16. The microcontroller of claim 14 wherein said volatile memory comprises a RAM memory.

17. The microcontroller of claim 14 wherein said volatile memory comprises a static RAM memory.

18. The microcontroller of claim 14 wherein said volatile memory comprises a cache memory.

19. The microprocessor of claim 14 wherein said means for disabling the electronic system other than the microcontroller further comprises:

means for holding a reset line down after a power-up of said microcontroller; and means for releasing the reset line after said volatile memory has been tested.

20. The microcontroller of claim 14 further comprising:

means for replacing it failed memory cell with a redundant memory cell.

* * * * *